United States Patent [19]
Scott et al.

[11] Patent Number: 5,321,284
[45] Date of Patent: Jun. 14, 1994

[54] HIGH FREQUENCY FET STRUCTURE

[75] Inventors: Bentley N. Scott, Richardson; Dale E. Zimmerman, Dallas, both of Tex.

[73] Assignee: Texas Instruments Incorporated, Dallas, Tex.

[21] Appl. No.: 453,244

[22] Filed: Dec. 18, 1989

Related U.S. Application Data

[63] Continuation of Ser. No. 628,185, Jul. 6, 1984, abandoned.

[51] Int. Cl.$^5$ .............................................. H01L 29/80
[52] U.S. Cl. .................... 257/282; 257/256; 257/280; 257/471; 257/476
[58] Field of Search ................ 357/22 I, 22 H, 23.2, 357/41, 15, 23.14; 257/256, 280, 282, 471, 472, 476, 742

[56] References Cited

U.S. PATENT DOCUMENTS

| | | | |
|---|---|---|---|
| 3,652,908 | 3/1972 | Lepselter et al. | 257/471 |
| 4,389,660 | 6/1983 | Decker | 357/22 H |
| 4,422,087 | 12/1983 | Ronen | 357/22 |
| 4,498,093 | 2/1985 | Allyn et al. | 357/15 |
| 4,628,338 | 12/1986 | Nakayama et al. | 257/282 |
| 4,695,869 | 9/1987 | Inoue et al. | 357/15 |

FOREIGN PATENT DOCUMENTS

| | | | |
|---|---|---|---|
| 54-06777 | 1/1979 | Japan | 357/22 |
| 58-131775 | 8/1983 | Japan | 357/22 |

OTHER PUBLICATIONS

IEEE Transactions on Electron Devices 1983 vol. 30 p. 1861 by Sugiura.
Solid State Electronics 1982 by Heilblum vol. 25 p. 185.
Electron Letters 1981 by Meignant vol. 17 p. 107.

Primary Examiner—Mark V. Prenty
Attorney, Agent, or Firm—Richard A. Stoltz; James C. Kesterson; Richard L. Donaldson

[57] ABSTRACT

A GaAs field effect transistor with a source contact including both an ohmic contact and a Schottky barrier, the Schottky barrier between the ohmic contact and the gate, is disclosed. The Schottky barrier provides a high frequency source contact close to the active channel and thereby reduces the parasitic source resistance at microwave and higher frequencies.

4 Claims, 2 Drawing Sheets

HIGH FREQUENCY FET STRUCTURE

This application is a continuation of application Ser. No. 06/628,185, filed Jul. 6, 1984 and now abandoned.

BACKGROUND OF THE INVENTION

The present invention relates to field effect semiconductor devices, and, more particularly, to the source contact of high frequency field effect devices.

Field effect transistors (FET) fabricated from gallium arsenide and with Schottky barrier gates are commonly used for microwave devices. Indeed, GaAs monolithic microwave integrated circuits (MMIC) of such devices covering a wide range of microwave applications have been reported. See, generally, the December 1983 special issues of IEEE Trans.Elec.Devices and IEEE Trans. Micwv.Th.Tech.

The typical such FET is fabricated on semi-insulating GaAs with a n-type epilayer about 0.1 to 0.4 microns thick by evaporation of aluminum gates and deposition, lift off, and alloying of gold-germanium source and drain ohmic contacts. Channel widths may be several hundred microns, whereas channel lengths are on the order of one micron. For MMICs the use of localized implantation for isolation is common and fabrication may be by the following steps: patterned photoresist and donor implant to define the active region (which will include the source, drain, and channel regions), activation of the implant, patterned photoresist and heavy donor implant to define the source and drain within the active region, activation, deposition of aluminum by vacuum evaporation, etching of the Al to define the Schottky barrier gates, and lifting off a AuGe-Ni film and alloying it at 400 degrees C. to form ohmic contacts with the source and drain regions. In either case the use of AuGe type ohmic contacts is usual. See, for example, Sugiura et al, 12-GHz-Band Low-Noise GaAs Monolithic Amplifiers, 30 IEEE Trans. Elec.Devices 1861 (1983).

For microwave operation the FET is normally biased in the saturation region, and in the saturation region the transconductance is strongly affected by the parasitic source resistance (the resistance primarily between the active channel and the ohmic source contact). See, S.Sze, Physics of Semiconductor Devices p.341 (2d Ed. 1980), where the measured transconductance of a real FET is equal to $gm/1+g_m R_s$ with gm being the ideal transconductance and $R_s$ the source resistance. Further, the source resistance also degrades the noise figure and power performance of the FET. Consequently, efforts to reduce the source resistance have been made and include moving the source contact closer to the active channel, recessing the gate, and increasing the doping underneath the source contact. See, Sugiura, cited above, commenting that the recessed gate degrades the uniformity of the active layer and using shortened source to gate spacings appears a better approach. However, M. Heilblum et al, Characteristics of AuGeNi Ohmic Contacts to GaAs, 25 Solid-State Elec.185 (1982), suggest that the formation of the usual ohmic contacts for the FET leads to limitations on the ability to move the source contact closer to the active channel and reduce the source resistance; namely, a high resistance layer under the contact several thousand angstroms deep dominates the contact resistance, and a peripheral zone extending about one micron from the contact into the GaAs exists in which the GaAs chemically differs from the rest of the GaAs. Source resistances in the range of three to four ohms for a three hundred micron wide gate seem to be the best obtainable with the known FET structures.

D.Meignant and D.Boccon-Gibod, Schottky Drain Microwave GaAs Field Effect Transistors, 17 Elec.-Lett. 107 (1981) have suggested using a Schottky barrier drain contact instead of an ohmic contact, but note that ohmic source contact (gold-germanium) is still a necessity.

Thus the known FET structures have a problem of high source resistance which degrades device performance.

SUMMARY OF THE INVENTION

The present invention provides a field effect transistor structure with two source contacts: one for dc bias and one for high frequency signals. A first preferred embodiment includes a gallium arsenide microwave device with a gold-germanium alloyed source contact for dc bias current and a Schottky barrier formed on the gallium arsenide adjacent the gold-germanium for a capacitive source contact for high frequency signals. The Schottky barrier metal may be deposited directly on the gold germanium and extend onto the gallium arsenide to within a very small distance of the gate; this leads to a slight reverse bias of the Schottky barrier during operation and its location very close to the gate means that it is effectively in parallel to the source resistance of the device. The capacitance of the Schottky barrier thereby provides a high frequency low impedance parallelling the source resistance of the device.

A second preferred embodiment again provides a Schottky barrier very close to the device gate in order to parallel the source resistance with a low impedance, but this Schottky barrier metal is only capacitively coupled to the gold-germanium source contact so that the barrier may be forward biased and thereby reduce its impedance.

Thus the problem of high source resistance in the known field effect transistor structures is solved by the present invention.

DETAILED DESCRIPTION OF THE PREFERRED EMBODIMENTS

Figure 1:
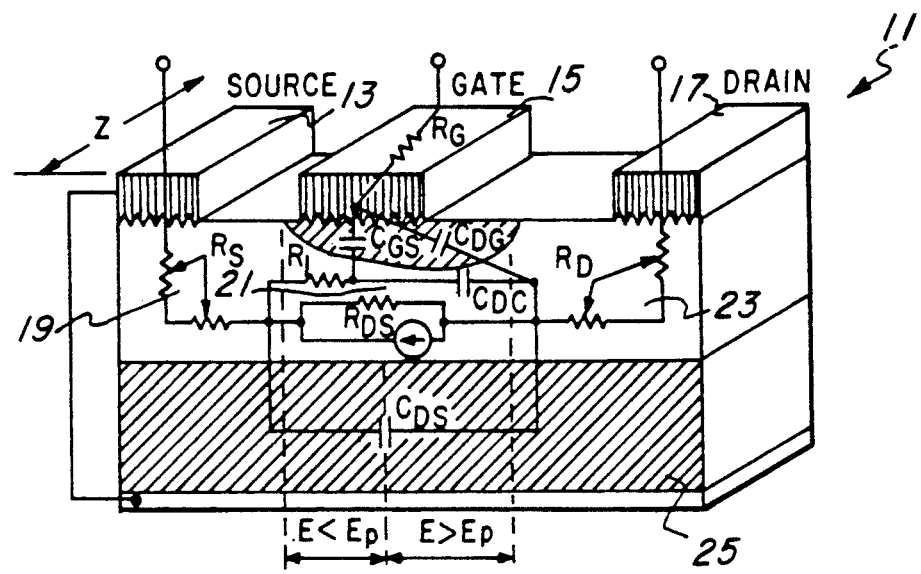
FIG. 1 is a schematic cross section of a field effect transistor illustrating the physical origin of the various elements of the small signal equivalent circuit of FIG. 2.

In order to fully understand the preferred embodiments we first consider the structure of a typical microwave field effect transistor (FET) fabricated from gallium arsenide with a Schottky barrier gate and gold-germanium source and drain contacts. FIG. 1 is a schematic cross section of such a FET, generally denoted 11, and indicates source contact 13, gate 15, drain contact 17, source region 19, channel region 21, drain region 23, and semi-insulating substrate 25. Typically, source region 19, channel region 21, and drain region 23 are formed in a doped epilayer about one micron thick grown on substrate 25. The distance between source contact 13 and gate 15 is typically one micron; note that gate 15 is typically aluminum whereas contacts 13 and 17 are Au-Ge and alloyed to the GaAs, so source contact 13 and gate 15 are defined in different steps. Gate 15 is typically 300 microns wide but only one micron long.

Figure 2:
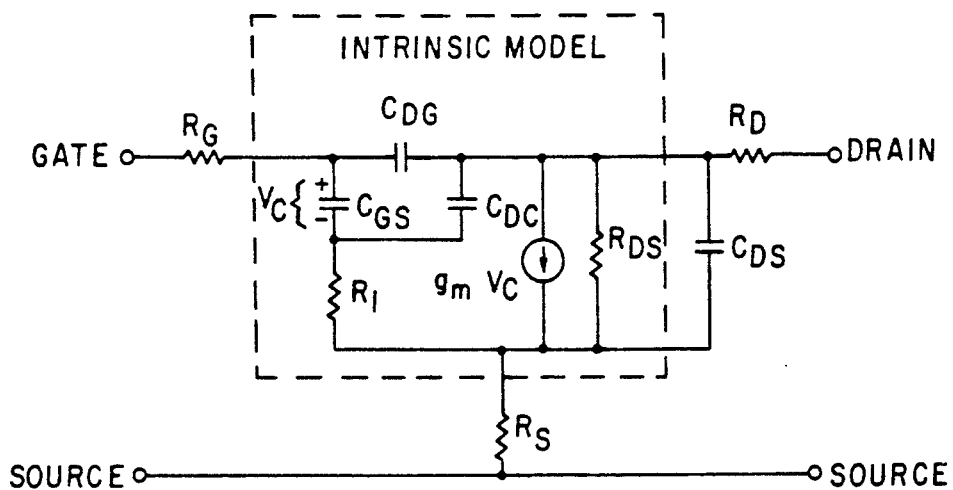
FIG. 2 is a small signal equivalent circuit of the field effect transistor of FIG. 1.

FIG. 2 is a small signal equivalent circuit for device 11 dc biased in the saturation region and operating in the common source mode. The physical origin of the various circuit elements for the equivalent circuit is indicated in FIG. 1. The circuit element of interest in the present invention is the source resistance, denoted Rs in FIGS. 1 and 2, which is typically in the range of 3 or more ohms for 300 micron wide gate devices.

Figure 3:
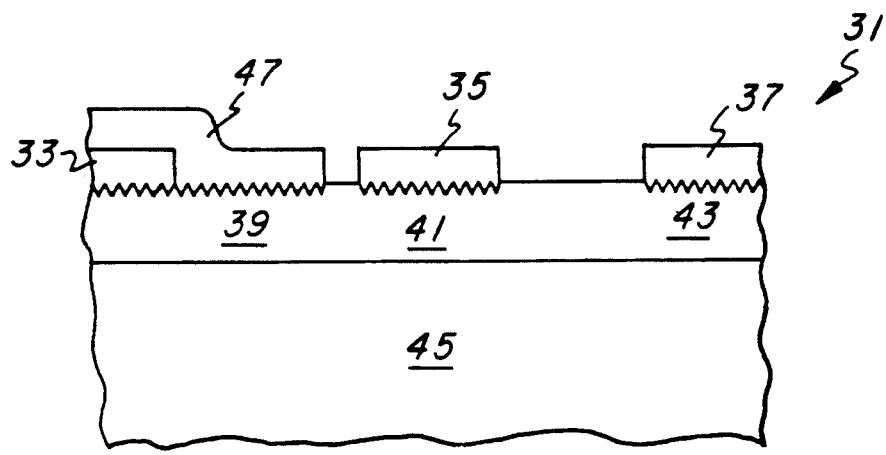
FIG. 3 is a schematic cross section of a first preferred embodiment field effect transistor with a Schottky barrier for source resistance bypass.

FIG. 3 is a schematic cross section of a first preferred embodiment FET, generally denoted 31, and includes source contact 33, gate 35, drain contact 37, source region 39, channel region 41, drain region 43, substrate 45, and Schottky barrier metal 47. As with device 11, substrate 45 is semiinsulating GaAs, regions 39, 41 and 43 are formed in an n-type GaAs layer about 0.1 micron thick and epitaxially grown on substrate 45, contacts 33 and 37 are Au-Ge alloyed to the GaAs, and gate 35 is aluminum. Metal 47 is also aluminum and forms a Schottky barrier with region 39 and an ohmic connection with contact 33. The distance between gate 35 and metal 47 may be conveniently made as small as 0.1 micron; note that gate 35 and metal 47 may be formed during the same processing step so the distance between them does not rely upon mask alignment accuracy.

Device 31 is normally operated in the saturation region, and the dc current flowing through source region 39 thus causes a slight potential drop along the Schottky barrier formed by metal 47 so that the Schottky barrier is slightly reversed biased with the bias being greatest closest to gate 35. The depletion-layer capacitance of the Schottky barrier provides a low impedance essentially parallel to the source resistance (located in region 39 and at the interface zone with contact 33) for high frequency signals superimposed on the dc saturation current. This capacitance is about 0.6 pF for device 31 (300 micron wide gate and a doping level of about 2E17 per cc in region 39) and may be modeled parallel to the source resistance because the distance between metal 47 and gate 35 is so small. Thus, in FIG. 2 a 0.6 pF capacitance would appear parallel to the vertical Rs in the lower portion of the figure. At 20 GHz this capacitance is a 14 ohm impedance, and at higher frequencies is less.

Figure 4:
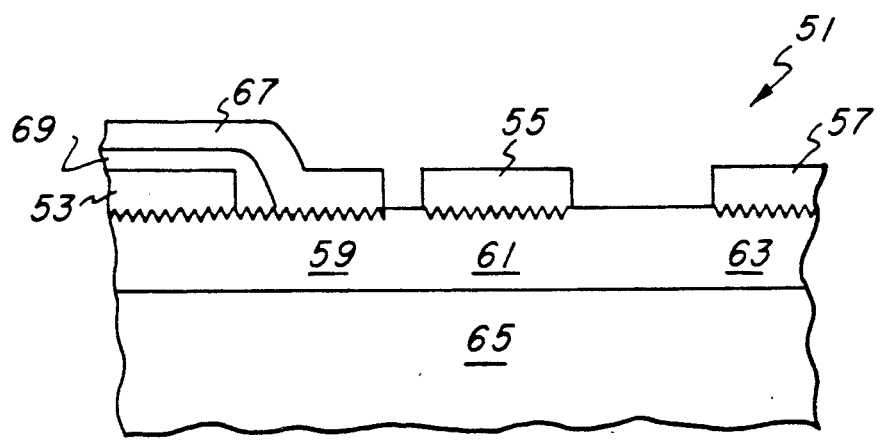
FIG. 4 is a schematic cross section of a second preferred embodiment field effect transistor with a Schottky barrier for source resistance bypass.

A second preferred embodiment device is shown in schematic cross section in FIG. 4 and generally denoted 51. Device 51 includes substrate 65, source region 59, channel region 61, drain region 63, source contact 53, gate 55, drain contact 57, Schottky barrier metal 67, and insulator 69. As with device 31, substrate 65 is semi-insulating GaAs, regions 59, 61, and 63 are formed in n-type epitaxially grown GaAs layer about 0.1 micron thick, contacts 53 and 57 are Au-Ge alloyed to the GaAs, gate 55 and metal 67 are aluminum. Insulator 69 may be silicon nitride 2000 Å thick. Gate 55 is 300 microns wide and about one micron long.

Metal 67 forms a Schottky barrier with source region 59 and is at a distance of 0.1 micron from gate 55. Metal 67 is separated from source contact 53 by insulator 69; but insulator 69 is only about 2000 Å thick and the large area of overlap of metal 67 on source contact 53 implies that metal 67 is capacitively coupled to contact 53 through a capacitance of about 20 pF. Thus metal 67 is dc isolated from contact 53, but at frequencies over 10 GHz the impedance between metal 67 and contact 53 is less than 1 ohm. Further, the Schottky barrier between metal 67 and region 59 may be forward biased, injecting dc current into region 59, but lowering the barrier impedance. Indeed, the barrier capacitance varies as a constant times the reciprocal of the square root of $V_{bi}-V-kT/q$, where $V_{bi}$ is the built-in potential of the barrier, V is the forward bias, and k, T, and q the standard Boltzmann's constant, temperature, and electron charge. Note that as V approaches $V_{bi}-kT/q$, the capacitance becomes unbounded. This low barrier impedance is essentially in parallel with the source resistance because metal 67 is so close to gate 55, and with a forward bias of 0.4 volts the capacitance is about 5 pF for device 51. Thus the source resistance of device 51 is paralleled by capacitances of 5 pF and 20 pF in series; and at 20 GHz this is less than 2 ohms.

Modifications of the foregoing preferred embodiments that still will perform bypassing of the source resistance include use of different materials, different geometries of the FET (such as recessed gate) provided that the Schottky barrier bypass can be located very close to the gate, different doping levels, different integration scales (single devices to MMIC), and so forth.

We claim:

1. A field effect transistor, comprising:
   (a) a field effect transistor having a source region, a drain region and a channel region therebetween;
   (b) a first ohmic contact at said source region of said transistor;
   (c) a second contact at said source region of said transistor connected in parallel with said first ohmic contact, said second contact disposed over said first ohmic contact and providing a Schottky barrier with said source region; and
   (d) an insulator separating said second contact from said first ohmic contact, said second contact being capacitively coupled to said first ohmic contact.

2. A field effect transistor, comprising:
   (a) a semiconductor substrate having a field effect transistor disposed therein, said transistor having channel, source, and drain regions;
   (b) a gate electrode disposed on said channel region;
   (c) a drain contact providing an ohmic contact at said drain region; and
   (d) a source contact structure including a first ohmic source contact contacting said source region and a second contact at said source region in parallel with said first ohmic source contact and providing a Schottky barrier with said source region;
   (e) said Schottky barrier located between said gate electrode and said first ohmic source contact,
   (f) said second contact being capacitively coupled to said first source contact.

3. The transistor of claim 2, wherein:
   (a) said first source contact includes gold and germanium.

4. The transistor of claim 2, further comprising:
   (a) an insulator between said first source contact and said second contact, said insulator including silicon nitride.

* * * * *